United States Patent
Kowarik et al.

(10) Patent No.: US 6,404,668 B2
(45) Date of Patent: Jun. 11, 2002

(54) MEMORY CONFIGURATION INCLUDING A PLURALITY OF RESISTIVE FERROELECTRIC MEMORY CELLS

(75) Inventors: Oskar Kowarik, Neubiberg; Kurt Hoffmann, Taufkirchen, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/767,807

(22) Filed: Jan. 22, 2001

Related U.S. Application Data

(63) Continuation of application No. PCT/DE99/00920, filed on Mar. 25, 1999.

(51) Int. Cl.[7] .............................................. G11C 11/22
(52) U.S. Cl. ...................................... 365/145; 365/149
(58) Field of Search ................................. 365/145, 149

(56) References Cited

U.S. PATENT DOCUMENTS

| | | | | |
|---|---|---|---|---|
| 4,712,876 A | | 12/1987 | Umeda et al. | |
| 4,818,077 A | * | 4/1989 | Ohwada et al. | 350/333 |
| 5,038,323 A | * | 8/1991 | Shcwee | 365/145 |
| 5,598,366 A | * | 1/1997 | Kraus et al. | 365/145 |
| 5,898,609 A | | 4/1999 | Yoo | |
| 6,055,175 A | * | 4/2000 | Kang et al. | 365/145 |

* cited by examiner

*Primary Examiner*—Son T. Dinh
(74) *Attorney, Agent, or Firm*—Laurence A. Greenberg; Werner H. Stemer; Ralph E. Locher

(57) ABSTRACT

A memory configuration includes a plurality of resistive ferroelectric memory cells. Each of the resistive ferroelectric memory cells includes a selection transistor and a storage capacitor. The selection transistor has a given zone of a first conductivity type. The storage capacitor has a first electrode and a second electrode. The first electrode is supplied with a fixed cell plate voltage. The second electrode is connected to the given zone of the first conductivity type. A semiconductor body of a second conductivity type opposite the first conductivity type is provided. A line is formed by a highly doped zone of the first conductivity type. The line is supplied with the cell plate voltage. The second electrode of the storage capacitor is connected via the resistor to the line.

9 Claims, 3 Drawing Sheets

MEMORY CONFIGURATION INCLUDING A PLURALITY OF RESISTIVE FERROELECTRIC MEMORY CELLS

CROSS-REFERENCE TO RELATED APPLICATION

This application is a continuation of copending International Application No. PCT/DE99/00920, filed Mar. 25, 1999, which designated the United States.

BACKGROUND OF THE INVENTION

Field of the Invention

The invention relates to a memory configuration which is formed of a plurality of resistive ferroelectric memory cells. Each of the memory cells is formed of a selection transistor and a storage capacitor. One electrode of the storage capacitor is connected to a fixed cell plate voltage and the other electrode of the storage capacitor is connected to a zone of the storage capacitor that has a first conductivity type. The selection transistor and the storage capacitor are provided in or on a semiconductor substrate of a second conductivity type opposite the first conductivity type.

Ferroelectric memory configurations in which the cell plate voltage is permanently set to half the supply voltage (Vcc/2) of the memory configuration are characterized by rapid memory operations. However, in these memory configurations, there is the problem of a possible loss of the data stored in the storage capacitors. Because the cell nodes at the storage capacitors are floating as long as the selection transistors are switched off and these cell nodes form parasitic pn-junctions to the semiconductor substrate, unavoidable leakage currents via the pn-junctions cause the cell node voltage to drop to a ground voltage Vss. The other nodes of the ferroelectric storage capacitors remain here at the fixed cell plate voltage Vcc/2. As a result, the contents of the ferroelectric storage capacitors can be corrupted by reprogramming.

In order to avoid this data loss, in a way similar to DRAMs (Dynamic Random Access Memory Cells), the memory cells are refreshed before their contents are destroyed. The refresh is carried out by the bit lines of the memory configuration being precharged to half the supply voltage Vcc/2, and the cell nodes being also charged to half the supply voltage Vcc/2 by activating the word lines, with the result that 0 V drops across the storage capacitors.

Such a refresh is complicated and requires additional operations which should be avoided if possible.

SUMMARY OF THE INVENTION

It is accordingly an object of the invention to provide a memory configuration having a plurality of resistive ferroelectric memory cells which overcomes the above-mentioned disadvantages of the heretofore-known memory configurations of this general type and which is configured in such a way that a leakage current at the cell node can no longer cause a reprogramming of the memory cell, with the result that a refresh of the memory cell can be dispensed with.

With the foregoing and other objects in view there is provided, in accordance with the invention, a memory configuration, including:

a plurality of resistive ferroelectric memory cells, each of the resistive ferroelectric memory cells including a selection transistor and a storage capacitor;

the selection transistor having a given zone of a first conductivity type;

the storage capacitor having a first electrode and a second electrode, the first electrode being supplied with a fixed cell plate voltage, the second electrode being connected to the given zone of the first conductivity type;

a semiconductor body of a second conductivity type opposite the first conductivity type;

the selection transistor and the storage capacitor respectively being provided in or on the semiconductor body;

a resistor;

a line formed by a highly doped zone of the first conductivity type, the line being supplied with the cell plate voltage; and the second electrode of the storage capacitor being connected via the resistor to the line.

In other words, the object of the invention is achieved in a memory configuration composed of a plurality of resistive ferroelectric memory cells of the type mentioned above in that the other electrode of the storage capacitor is connected via a resistor to a line which is supplied with the cell plate voltage.

According to another feature of the invention, the resistor has a first resistance value. The given zone of the first conductivity type and the semiconductor body form a pn-junction therebetween, and the pn-junction has a reverse resistance with a second resistance value substantially larger than the first resistance value.

According to yet another feature of the invention, the resistor has a given resistance value, the given resistance value is set such that memory read operations and memory write operations, in particular read operations from the resistive ferroelectric memory cells and write operations to the resistive ferroelectric memory cells, are substantially uninfluenced by the resistor.

The resistor in this case is constructed in such a way that its resistance value is substantially lower than the resistance value of the reverse resistance or blocking resistance of the pn-junction between the first zone of the selection transistor and the semiconductor substrate, and in such a way that the read and write operation is influenced by this resistor only to an extremely small degree.

This ensures that in the memory configuration according to the invention the resistance causes virtually no disruption to the read and write operation and nevertheless the leakage current of the parasitic pn-junction to the semiconductor substrate is compensated by this resistance and the voltage present on each side of the ferroelectric storage capacitor is approximately the cell plate voltage. Undesired reprogramming of the storage capacitor can thus no longer occur.

The significant feature of the invention is therefore that the end of the resistor which faces away from the first zone of the selection transistor is connected to the line supplied with the cell plate voltage. This line can preferably be a highly doped zone of the first conductivity type in the surface region of the semiconductor element.

There are various possible ways of implementing the resistor: It is, for example, expedient to provide the resistor through the use of a suitable doping underneath the insulating layer, the so-called thick oxide, in the semiconductor element in the region between the first zone of the selection transistor and the line which is preferably formed from a highly doped zone of the first conductivity type and is supplied with the cell plate voltage. Therfore, according, a preferred feature of the invention, the resistor is a doped layer provided in the semiconductor body; and an insulating layer is disposed above the doped layer.

However, it is also possible to use a MOS transistor for the resistor, a reference voltage being applied to the gate of the MOS transistor in such a way that the resistance with the desired properties, for example in the subthreshold current range, is obtained via the channel of the MOS transistor. Thus, according to a preferred feature of the invention, a MOS transistor has a gate to be supplied with an adjustable reference voltage, and the resistor is implemented by the MOS transistor. In particular, the resistor is formed by the channel region of the MOS transistor.

According to a further feature of the invention, the resistance value of the resistor is set by changing the adjustable reference voltage.

In addition to a constant gate voltage at the gate of the MOS transistor, after each read and write operation and when the supply voltage at the memory configuration is switched on and off, this gate voltage can be set to a value such that the individual electrodes of the storage capacitors, the so-called capacitance nodes, in the memory cells are quickly adjusted to the cell plate voltage.

With such a procedure it is advantageous that the capacitance nodes are adjusted to the cell plate voltage immediately after the respective operation. In this process, it is possible to select all the selection transistors, for example when the memory configuration is switched on and off, or else also to select just the selection transistor which is associated with the respective word line and bit line, with the word or bit line decoder using the voltage applied to the gate of the MOS transistor.

In the memory configuration according to the invention, unintended reprogramming occurring as a result of the leakage current of the parasitic pn-junction to the semiconductor substrate and when the memory configuration is switched on and off is not possible. In the same way, when the supply voltage is switched off, unintended reprogramming cannot take place either.

In addition, the memory configuration according to the invention is a very simple configuration. In particular, a normal word line decoder can be used with it. The capacitance of the word line is not increased either. There is no need for a plug between the resistor, which is preferably implemented through the use of a doping layer under an insulating layer in the semiconductor element, and the storage capacitor electrode which is supplied with the fixed cell plate voltage, which means that the requirements made of the manufacturing steps are reduced and less space is needed because a contact hole specifically for the plug is not necessary. This means that the memory cells of the memory configuration according to the invention require no more space than the cell space of a standard memory cell.

Other features which are considered as characteristic for the invention are set forth in the appended claims.

Although the invention is illustrated and described herein as embodied in a memory configuration composed of a plurality of resistive ferroelectric memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
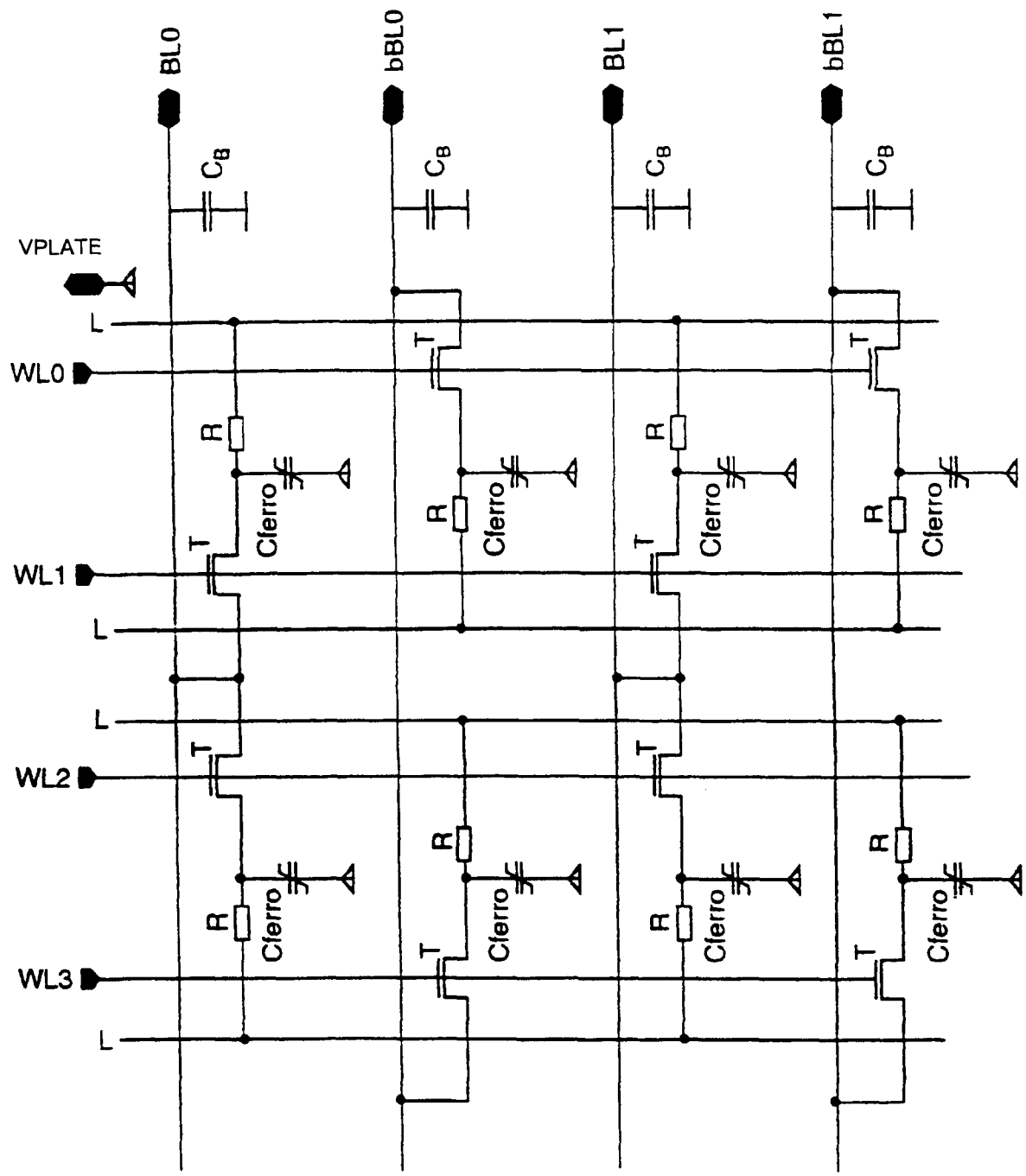
FIG. 1 is a circuit diagram of a memory cell field of the configuration according to the invention.

Referring now to the figures of the drawings in detail and first, particularly, to FIG. 1 thereof, there is shown a memory cell field in a folded bit line architecture with bit lines BL0, bBL0, BL1 and bBL1 having capacitors $C_B$ and with word lines WL0, WL1, WL2 and WL3, for single-transistor and single-capacitor (1T1C) memory cells composed of selection transistors T and ferroelectric storage capacitors Cferro.

A fixed cell plate voltage is supplied to one of the electrodes of the storage capacitors Cferro. According to the invention, the fixed cell plate voltage is supplied in each case from, for example, a resistor R and a line L formed of a highly doped zone of the first conductivity type in the semiconductor element. This highly doped zone can be, in particular, an $n^-$-type conductive strip-shaped zone.

The resistor R, which is connected between the storage capacitors Cferro and the line L which is supplied with the cell plate voltage VPLATE, must be constructed in such a way that (a) the resistance value of this resistor R is substantially lower than the resistance value of the reverse resistance of the pn-junction between the first zone of the selection transistor and the semiconductor substrate, and (b) the read and write operation is influenced by the resistor R only to an extremely small degree.

If these conditions for the resistor R are met, it is ensured that the read and write operation in the individual memory cells remains virtually unaffected by the resistor R, and the leakage current of the parasitic pn-junction to the semiconductor substrate is compensated by the current flowing through the resistor R. As a result, the voltage present on each side of the ferroelectric storage capacitors, that is to say at the two capacitance nodes, is approximately the cell plate voltage. Undesired reprogramming of the storage capacitors can then no longer occur.

The significant feature of the invention is that the terminal of the resistor R which is opposite the ferroelectric storage capacitor Cferro is held at the cell plate voltage VPLATE with the line L, with the result that when the selection transistor T is switched off virtually the same voltage is present at the ferroelectric storage capacitor Cferro, as a result of which a reprogramming of the ferroelectric storage capacitor Cferro is ruled out.

There are various ways of implementing the resistor R, and these will be explained in more detail below with reference to FIGS. 2 to 7. Basically, there is the possibility of constructing the resistor R through the use of suitable doping under the insulating layer next to the selection transistor (cf. FIGS. 2 and 3) or else of providing a MOS transistor for this resistor, which MOS transistor is set through the use of its gate voltage VR in such a way that a resistance with the desired properties is obtained via the channel of this MOS transistor (cf. FIGS. 4 to 7).

Figure 2:
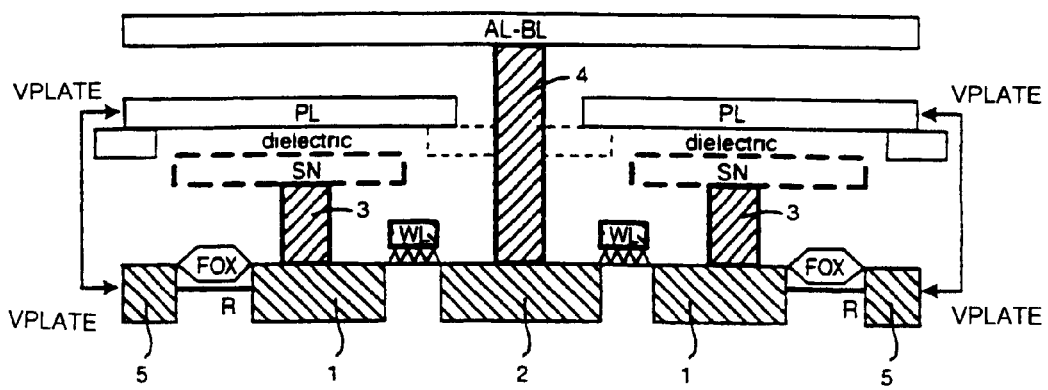
FIG. 2 is a schematic sectional view of a first exemplary embodiment of the memory configuration according to the invention.

FIG. 2 shows an n+-type conductive drain zone 1 and an n−-type conductive source zone 2 in the surface region of a p-type conductive semiconductor body, a word line WL being provided above the channel region between the drain zone 1 and the source zone 2. This word line WL is embedded in an insulating layer composed of, for example, silicon dioxide and/or silicon nitride. The drain zone 1 is connected to an electrode SN of a ferroelectric storage capacitor via a plug 3 composed of, for example, polycrystalline silicon, the dielectric of the ferroelectric storage capacitor isolating the electrode SN from a common electrode PL to which the cell plate voltage VPLATE is connected. The individual electrodes PL are connected to one another, as is indicated by dotted lines in FIG. 2.

The source zone 2 is connected via a plug 4 to a bit line AL-BL which is preferably composed of aluminum. This plug 4 is, of course, electrically isolated from the electrodes PL.

The resistor R is formed by suitable doping underneath the insulating layer or a thick oxide FOX between the drain zone 1 and a highly doped, n+-type conductive zone 5 via which the cell plate voltage VPLATE is supplied to the terminal of the resistor R which is opposite the drain zone 1.

Suitable doping concentrations for the resistor R are in the order of magnitude of the substrate doping. To increase the resistance in comparison with the substrate resistance, the doping concentration is less than the substrate doping concentration, and to reduce the resistance the doping concentration is greater than that of the substrate doping.

Figure 3:
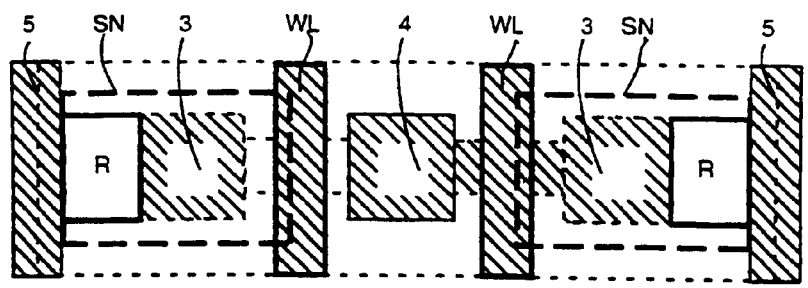
FIG. 3 is a schematic plan view of the memory configuration according to FIG. 2.
Figure 4:
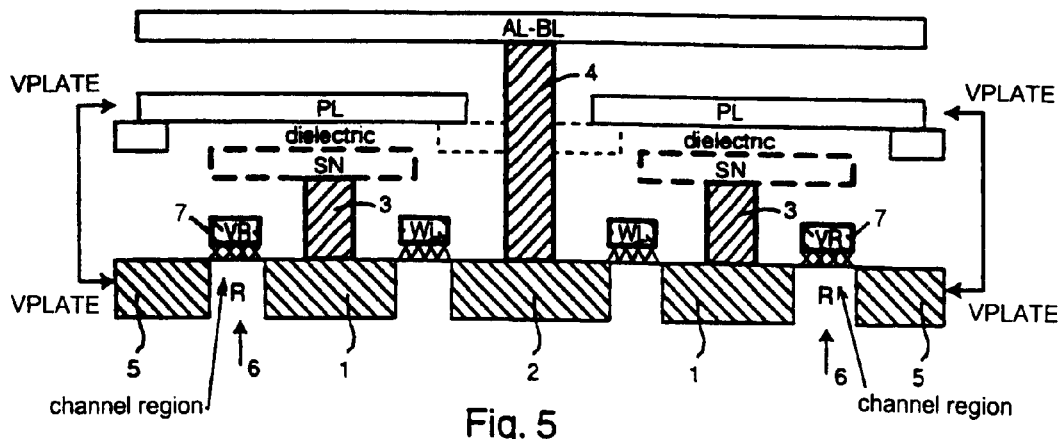
FIG. 4 is a schematic sectional view of a second exemplary embodiment of the memory configuration according to the invention.
Figure 5:
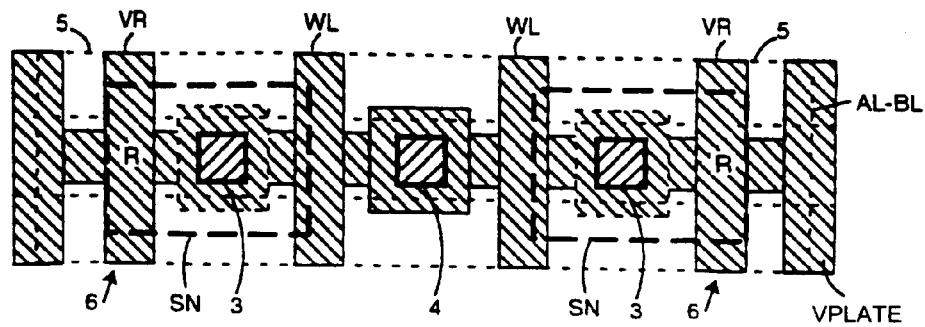
FIG. 5 is a schematic plan view of the memory configuration according to FIG. 4.
Figure 6:
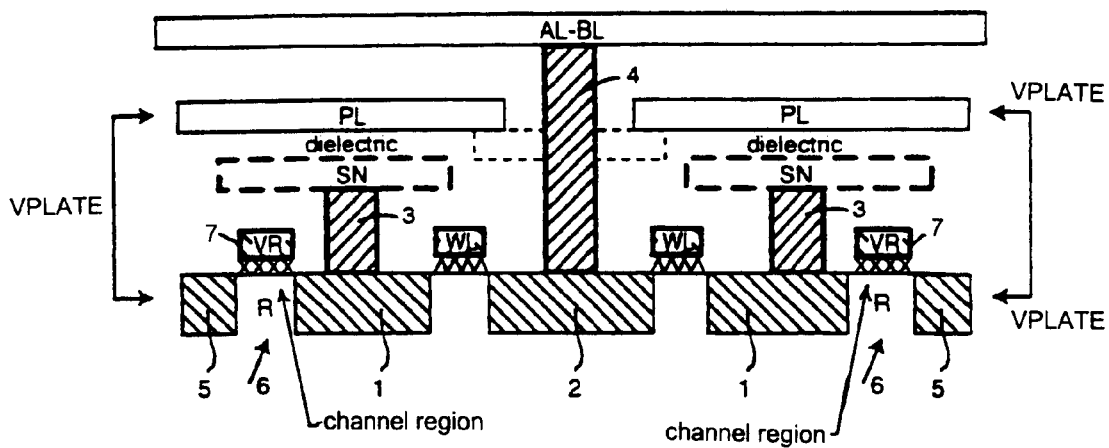
FIG. 6 is a schematic sectional view of a modified embodiment of the memory configuration according to FIG. 4.
Figure 7:
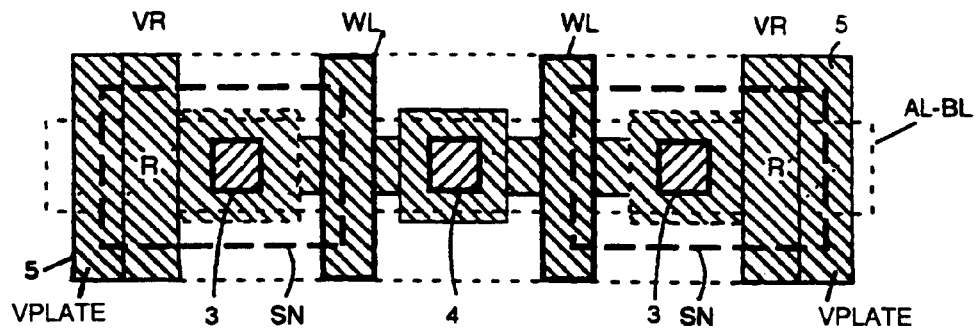
FIG. 7 is a schematic plan view of the memory configuration of FIG. 6.

FIGS. 4 and 5 show a second exemplary embodiment of the invention, while FIGS. 6 and 7 illustrate a refined embodiment of this exemplary embodiment. In FIGS. 4 to 7, the same reference symbols as in FIGS. 2 and 3 are used for components which correspond to one another.

In the exemplary embodiment in FIGS. 4 and 5, the resistor R is implemented through the use of a MOS transistor 6 to whose gate 7 a gate voltage VR is connected, the gate voltage VR being set in such a way that the resistance R with the desired properties is obtained through the use of the channel of the MOS transistor 6.

FIGS. 6 and 7 show a refined embodiment of the exemplary embodiment in FIGS. 4 and 5. Here, the resistor R is also implemented through the use of the MOS transistor 6 to which a suitable gate voltage VR is supplied, while the cell plate voltage VPLATE is applied via the n+-type conductive, highly doped zone 5. In contrast to the variant in FIGS. 4 and 5, use is made here of a so-called "aggressive layout" which permits a particularly compact configuration of the memory configuration and which does not require any additional process steps.

We claim:

1. A memory configuration, comprising:

a plurality of resistive ferroelectric memory cells, each of said resistive ferroelectric memory cells including a selection transistor and a storage capacitor;

said selection transistor having a given zone of a first conductivity type;

said storage capacitor having a first electrode and a second electrode, said first electrode being supplied with a fixed cell plate voltage, said second electrode being connected to said given zone of said first conductivity type;

a semiconductor body of a second conductivity type opposite said first conductivity type;

said selection transistor being provided in said semiconductor body, said storage capacitor being provided on said semiconductor body;

a resistor;

a line formed by a highly doped zone of said first conductivity type, said line being supplied with the cell plate voltage; and said second electrode of said storage capacitor being connected via said resistor to said line.

2. The memory configuration according to claim 1, wherein:

said resistor is a doped layer provided in said semiconductor body; and an insulating layer is disposed above said doped layer.

3. The memory configuration according to claim 1, including:

a MOS transistor having a gate to be supplied with an adjustable reference voltage; and said resistor being implemented by said MOS transistor.

4. The memory configuration according to claim 3, wherein said resistor has a resistance value set by changing the adjustable reference voltage.

5. The memory configuration according to claim 1, including:

a MOS transistor including a channel region and gate; and said resistor being formed by said channel region, said gate being supplied with an adjustable reference voltage.

6. The memory configuration according to claim 5, wherein said resistor has a resistance value set by changing the adjustable reference voltage.

7. The memory configuration according to claim 1, wherein:

said resistor has a first resistance value; and said given zone of said first conductivity type and said semiconductor body form a pn-junction therebetween, said pn-junction has a reverse resistance with a second resistance value substantially larger than said first resistance value.

8. The memory configuration according to claim 1, wherein said resistor has a given resistance value, said given resistance value is set such that read operations from said resistive ferroelectric memory cells and write operations to said resistive ferroelectric memory cells are substantially uninfluenced by said resistor.

9. The memory configuration according to claim 1, wherein said resistor has a given resistance value, said given resistance value is set such that memory read operations and memory write operations are substantially uninfluenced by said resistor.

* * * * *

UNITED STATES PATENT AND TRADEMARK OFFICE
CERTIFICATE OF CORRECTION

PATENT NO. : 6,404,668 B2  Page 1 of 1
DATED : June 11, 2002
INVENTOR(S) : Kurt Hoffmann et al.

It is certified that error appears in the above-identified patent and that said Letters Patent is hereby corrected as shown below:

<u>Title page,</u>
Item [75], should read as follows:
-- Inventors:  Kurt Hoffmann, Taufkirchen; Oskar Kowarik, Neubiberg, both of (DE) --
Item [30], should read as follows:
--          Foreign Application Priority Data
Jul. 22, 1998    (DE) ..........................198 32 995.4 --

Signed and Sealed this

Fifth Day of November, 2002

*Attest:*

*Attesting Officer*

JAMES E. ROGAN
*Director of the United States Patent and Trademark Office*